United States Patent
Reddy et al.

(10) Patent No.: US 7,026,838 B2
(45) Date of Patent: Apr. 11, 2006

(54) VERSATILE SYSTEM FOR ACCELERATED STRESS CHARACTERIZATION OF SEMICONDUCTOR DEVICE STRUCTURES

(75) Inventors: Vijay Kumar Reddy, Plano, TX (US); Prasun Raha, San Mateo, CA (US)

(73) Assignee: Texas Instruments Incorporated, Dallas, TX (US)

( * ) Notice: Subject to any disclaimer, the term of this patent is extended or adjusted under 35 U.S.C. 154(b) by 161 days.

(21) Appl. No.: 10/871,932

(22) Filed: Jun. 18, 2004

(65) Prior Publication Data

US 2005/0280477 A1    Dec. 22, 2005

(51) Int. Cl.
*G01R 31/26* (2006.01)

(52) U.S. Cl. .................. 324/769; 324/765; 324/763
(58) Field of Classification Search .............. None
See application file for complete search history.

(56) References Cited

U.S. PATENT DOCUMENTS

| | | | |
|---|---|---|---|
| 6,333,879 B1 * | 12/2001 | Kato et al. .............. | 365/201 |
| 6,628,134 B1 * | 9/2003 | Lee ........................ | 324/763 |
| 6,759,863 B1 * | 7/2004 | Moore .................... | 324/765 |

\* cited by examiner

*Primary Examiner*—Minh N. Tang
(74) *Attorney, Agent, or Firm*—Alan K. Stewart; W. James Brady, III; Frederick J. Telecky, Jr.

(57) ABSTRACT

The present invention provides a system (200) for performing accelerated stress characterization of a given transistor (204). Inverter circuits, formed from the given transistor, are disposed in series with one another (202). A plurality of signal taps is operatively associated with each gap between adjacent inverter circuits. Selective circuitry is operatively coupled to the plurality of signal taps, and adapted to output (206) data from a first and a second of the plurality of signal taps. A controlled voltage component (212) is operatively coupled the plurality of inverter circuits, and adapted to supply a desired supply voltage. A controlled signal component (210) is operatively coupled the plurality of inverter circuits, and adapted to supply a signal of a desired frequency thereto. An evaluation component (208) receives signal data from the first and second signal taps for evaluation or processing.

20 Claims, 2 Drawing Sheets

VERSATILE SYSTEM FOR ACCELERATED STRESS CHARACTERIZATION OF SEMICONDUCTOR DEVICE STRUCTURES

TECHNICAL FIELD OF THE INVENTION

The present invention relates generally to the field of semiconductor devices and, more particularly, to apparatus and methods for optimal accelerated stress characterization of semiconductor device structures.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor material properties and behaviors.

The increased packing density of the integrated circuit generates numerous challenges to the semiconductor manufacturing process. Every device must be smaller without damaging the operating characteristics of the integrated circuit devices. High packing density, low heat generation, low power consumption, and good reliability must be maintained without any functional device degradation.

Commonly, device manufacturers specify or define a number of boundary device design parameters (e.g., max/min voltage, max/min current) within which a desired device reliability level may be achieved, or even guaranteed. For example, a semiconductor device may be guaranteed an operational life of 10 years if its supply voltage is maintained at or below 5 Volts over that life. Often, such specifications are derived from a number of characterization tests and simulations performed on sample devices or device structures.

Many end equipment applications demand a guaranteed operational lifetime for a device operating at some fixed set or range of operating conditions. Where a semiconductor manufacturer is supplying devices utilizing a mature fabrication technology, a certain amount of historical data on the actual performance or degradation of the devices over some given lifetime may be available. Frequently, however, the manufacturer is producing the devices utilizing a new, state-of-the-art fabrication technology. In most cases, such technologies have not been in existence long enough to have actual lifetime performance or degradation data compiled. The device manufacturer must, nonetheless, determine some operational device lifetime that it will guarantee.

Manufacturers thus commonly rely on accelerated stress testing of sample device structures or devices. Such articles are dynamically stressed to levels far above their intended operating conditions, and data on critical operational or behavioral parameters at those dynamic stress levels is compiled. That data is then evaluated to develop characterizations or profiles of the device technology, from which the manufacturer may extrapolate to provide some guaranteed lifetime at normal operating conditions.

Unfortunately, however, the ability of a manufacturer to accurately characterize certain device operational or behavioral parameters independently has been somewhat limited by conventional characterization methodologies. Depending upon the manufacturing technology and upon the particular device structures being characterized, conventional characterization schemes may limit a manufacturer's ability to vary certain parameters independently during stress testing. As a result, characterizations of two or more parameters are often interdependent. Certain assumptions must then be made regarding the behavior of those parameters with respect to one another in order to evaluate and extrapolate characterization data. In a number of cases, those assumptions introduce a certain margin of error into characterization data. This margin of error can result in, for example, an overestimation or underestimation of the operational lifetime of a production device. Either situation is undesirable, subjecting either the device or end equipment manufacturer to unnecessary system failures or yield losses.

As a result, there is a need for a dynamic stress characterization system that effectively and accurately assesses accelerated testing parameters independently—decoupling variances in operational or behavioral parametric values from one another and providing optimal device characterization in an easy, efficient and cost-effective manner.

SUMMARY OF THE INVENTION

The present invention provides a versatile system, comprising a number of apparatus and methods, for decoupling variances in operational or behavioral parametric values during dynamic stress characterization. Comprehending certain complications arising out of parametric interdependencies, the system of the present invention effectively and accurately assesses accelerated testing parameters independently. The present invention thus provides optimal device characterization in an easy, efficient and cost-effective manner.

Specifically, the present invention provides a segregated test circuitry and methodology that effectively isolates a sample device or structure (the "sample"), in such a way that certain operational or behavioral characteristics of the sample may be evaluated independently. The present invention provides an evaluation structure that comprises some arrangement (e.g., daisy chain, array) of one or more samples. The evaluation structure is operatively coupled to a plurality of control components. The control components are adapted such that each provides independent control of a distinct operational parameter (e.g., voltage, oscillation frequency) of the evaluation structure. Each parameter may thus be varied independently, while all other parameters are held constant. Parameters of concern are varied as desired while data from the evaluation structure is monitored or recorded. Sample behavioral and operational data, directly correlated to a single varying parameter, is compiled and evaluated to provide an accurate characterization profile.

In one particular embodiment, the present invention is applied to transistor degradation and reliability models, during the development of characterizations or design rules for a given semiconductor technology. A simple, transistor-based structure, such as an inverter, is provided as a sample from which data is compiled. A plurality of inverters is arranged in a multi-tap delay chain. This evaluation structure is operatively coupled to controlled frequency signal component, as well as a stress voltage component. These components vary signal frequency and stress voltage independently, as data from the delay chain is evaluated or recorded. The effects of voltage or frequency stresses are then correlated to degradation of inverter delay times. This data may then be extrapolated or otherwise interpreted to develop models representative of transistor lifetime performance.

More specifically, one embodiment of the present invention provides a system for performing accelerated stress characterization of a given transistor. Inverter circuits, formed from the given transistor, are disposed in series with one another. A plurality of signal taps is operatively associated with each gap between adjacent inverter circuits. Selective circuitry is operatively coupled to the plurality of signal taps, and adapted to output data from a first and a second of the plurality of signal taps. A controlled voltage component is operatively coupled the plurality of inverter circuits, and adapted to supply a desired supply voltage. A controlled signal component is operatively coupled the plurality of inverter circuits, and adapted to supply a signal of a desired frequency thereto. An evaluation component receives signal data from the first and second signal taps for evaluation or processing, as behavioral or performance models or design rules are developed.

Another embodiment of the present invention provides a method of characterizing performance of a given transistor. The method involves providing a plurality of inverter circuits, formed from the given transistor, disposed in series with one another. A plurality of signal taps, each respectively and operatively associated with one gap between adjacent inverter circuits in the series thereof, is provided. Selective circuitry is operatively coupled to the plurality of signal taps and adapted to select a first and a second of the plurality of signal taps. A fixed frequency source signal is supplied to the plurality of inverter circuits, and a first supply voltage is supplied to the plurality of inverter circuits. A first set of signal data from the first and second signal taps is compiled. A second supply voltage is supplied to the plurality of inverter circuits, and a second set of signal data from the first and second signal taps is compiled. The first and second sets of signal data are processed to determine a desired transistor performance characteristic.

The present invention further provides a semiconductor device characterization system. The system comprises an evaluation structure, having an arrangement of one or more sample devices. A first control component is operatively coupled to the evaluation structure and adapted to control a first operational parameter of the evaluation structure. A second control component is operatively coupled to the evaluation structure and adapted to control a second operational parameter of the evaluation structure, independent of any variance in the first operational parameter. An evaluation component is adapted to receive and compile data from the evaluation structure as either the first or second operational parameters are varied.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

Figure 1:
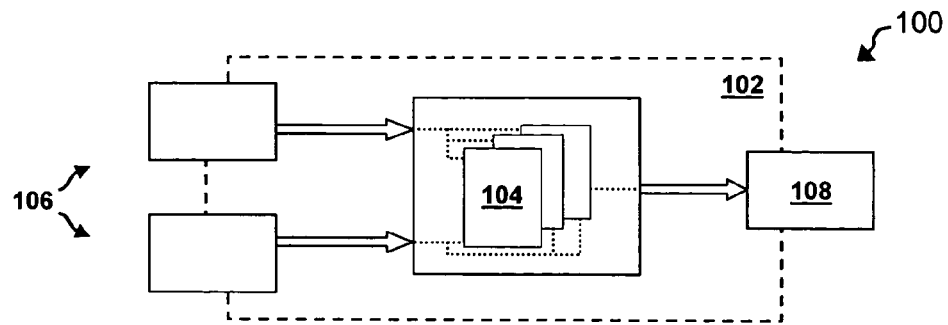
FIG. 1 provides an illustration depicting one embodiment of the present invention.

While the making and using of various embodiments of the present invention are discussed in detail below, it should be appreciated that the present invention provides many applicable inventive concepts, which can be embodied in a wide variety of specific contexts. The present invention is hereafter illustratively described in conjunction with accelerated dynamic stress testing of transistor structures for the development of semiconductor process characterization or design rules. The specific embodiments discussed herein are, however, merely demonstrative of specific ways to make and use the invention and do not limit the scope of the invention.

The present invention provides a versatile system, comprising a number of apparatus and methods, for decoupling variances in operational or behavioral parametric values during dynamic stress characterization. As described briefly hereinafter, complications can arise from parametric interdependencies inherent in many conventional characterization or test schemes. These interdependencies can result in subtle, if not greater, inaccuracies in extrapolations based on compiled characterization or test data. The system of the present invention effectively obviates such interdependencies, providing an accurate assessment of accelerated testing parameters.

For purposes of explanation and illustration, it is useful to understand certain aspects of an illustrative device characterization application, and some of the aforementioned issues that arise therein. Consider, for example, the formation of transistor structures utilizing CMOS processes, and the design libraries that must be specified for use with such processes. Among the most prevalent degradation mechanisms having a substantial impact on long-term device reliability are channel hot carrier (CHC) effects. This is especially true in deep submicron CMOS technologies, where transistor geometries—especially gate oxide thicknesses—are continually shrinking to achieve higher performance.

Moreover, substrate doping can be very high in such device structures. Commonly, operation of such device structures can generate very high electric fields (e.g., ~250 kV/cm) within certain device regions. As current flows from, for example, the source region of a transistor to the gate region, current carriers (i.e., electrons) passing through high electric fields within the substrate take on energy from the field(s). The highly energized (hot) carriers then proceed to and through a transistor's relatively thin and fragile gate oxide structure. With enough energy, the hot carriers can compromise or even destroy the gate oxide, or its interface to surrounding structures (e.g., the channel structure)), degrading the integrity and performance of the transistor. Weaker and slower transistors of question reliability typically result.

This causes a number of problems when a device manufacturer is attempting to determine or specify operational conditions and lifetime of a device technology utilizing such a transistor. In attempts to address this, manufacturers must be able to quantify and qualify such degradation mechanisms and their effects in order to properly develop design and operation specifications for the technology.

In conventional methodologies, dynamic CHC transistor degradation models for reliability design rules are commonly generated utilizing CMOS ring oscillator (RO) circuitry. These RO circuits typically comprise an odd number of inverter stages in series. Inverters are commonly used since they are one of the simplest transistor structures that can be formed having both CMOS technology types (i.e., NMOS and PMOS) in a single structure. Furthermore, in most cases, inverters comprise only transistors—the very structure(s) that a manufacturer is interested in characterizing or modeling.

Generally, inverter-based ROs are supplied with some sort of periodic input signal (e.g., a sine wave), and output an inverse of the periodic signal. Hot carrier damage, if any, generally occurs when the transistors in an RO are switching state, due to the substrate current (i.e., high fields) generated during the transition period.

Such effects increase dramatically during accelerated testing, when voltage levels and RO frequency are increased significantly. Transistor structures are thus forced to transition between zero and higher voltages, and the transitions occur more frequently. Thus the opportunities for, and occurrences of, CHC degradation increase proportionally, as CHC damage or degradation is proportional to operational voltage and frequency.

Without the aid of the present invention, most such conventional characterization systems provide for control of only a single parametric variable—the stress voltage supply ($V_{DDstress}$). $V_{DDstress}$ is varied across a desired range of values, and device failure times are compiled for each value. Depending upon the process technology and the desired performance characteristics, failure times can be defined in varying ways. Often, failure time is defined as the time at which a device structure reaches some predetermined level of slow down in its operational frequency (e.g., 5% slow down, 10% slow down, etc.). Operational frequency is commonly used to measure of failure time since, for many applications, operational frequency is a critical parameter. In other applications, however, failure time can be defined as some percentage degradation in some other performance parameter (e.g., output current, threshold voltage). Using accelerated stress testing, failure times from higher stress conditions are evaluated, and then extrapolated back to normal operating conditions to determine a normal transistor operational life for a given set of operating conditions.

Unfortunately, however, conventional characterization systems without the aid of the present invention must, by necessity, overlook operational frequency variances that occur in response to the variances in $V_{DDstress}$. Without its own independent control or stabilization, however, operational frequency cannot be evaluated independently. Thus, operational frequency of conventional RO circuits becomes, for characterization purposes, a variable that must be treated as a constant. In a number of conventional methodologies, operational frequency is assumed to vary linearly with $V_{DDstress}$. In many cases, however, frequency variance could actually be much higher or lower than the variance in $V_{DDstress}$. As a result, evaluations or extrapolations to determine transistor operational lifetime can be substantially overestimated or underestimated.

In contrast, the present invention recognizes the need to fully decouple the variances between the operational frequency, stress voltages, and other dynamic stress parameters in order to develop accurate and reliable characterization models and design rules. In response, the present invention provides a segregated test circuitry and methodology that effectively isolates a sample structure in such a way that particular operational or behavioral characteristics of interest may be evaluated independently.

Referring now to FIG. 1, one illustrative embodiment of a characterization system 100 according to the present invention is depicted. System 100 comprises an evaluation structure 102. Structure 102 comprises some arrangement (e.g., daisy chain, array) of one or more sample structures 104. Structure 102 and, either directly or indirectly, structures 104 are operatively coupled to a plurality of control components 106.

Control components 106 each provide independent control of a distinct operational parameter of, or input to, structure 102 (e.g., supply voltage levels, signal forms and frequencies). Depending upon the nature and operation of each component 106, each may be interoperable with one or more of its counterparts to provide or receive necessary signals, currents, voltages, etc. Utilizing components 106, each operational parameter may be varied independently, while all other parameters are held constant. If desired or necessary, the components may be adapted to vary parameters simultaneously.

System 100 further comprises an evaluation component 108. Component 108 is operatively coupled to structure 102 to provide monitoring, recording or other evaluation of the operational or behavioral characteristics of sample(s) 104, as a particular control component 106 varies its associated operational parameter. Each component 106 may be coupled to component 108 to provide data on operational states. Component 108 may comprise: one or more data processing constructs executed by a processor; printed or visual data output in tabular or graphical; or any other suitable system that would compile characterization data from system 100 in accordance with the present invention. As parameters of concern are varied, data from structure 102 is monitored or recorded by component 108. Behavioral or operational data from structure 102 is directly correlated to variance by a single control component 106. This data is then processed to provide an accurate characterization profile or model, from which accurate and reliable lifetime specifications may be derived.

Figure 2:
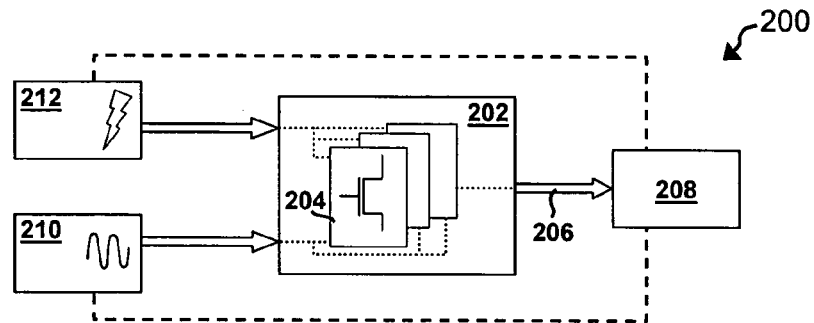
FIG. 2 provides an illustration depicting another embodiment of the present invention.

Turning now to a more specific example, FIG. 2 illustrates certain aspects of one embodiment of the present invention with reference to another characterization system 200. System 200 depicts an application of the present invention to developing transistor degradation and reliability models, during semiconductor process characterization or design rule development. System 200 comprises an evaluation structure 202. Structure 202 comprises some simple, transistor-based sample structure 204 (i.e., an inverter). A plurality of structures 204 is arranged in a multi-tap delay chain. This is described in greater detail hereinafter in reference to FIG. 3. An output 206 from structure 202 to an evaluation component 208 provides component 208 with data on delay time between selected taps on the chain.

Structure 202 is operatively coupled to controlled frequency signal component 210, as well as to a stress voltage component 212. Component 212 provides a variable stress voltage supply, representative of operation supply voltage, to each of the structures 204. Voltage supplied by component 212 may be varied greatly, depending upon the intended operational voltage ($V_{DDop}$) for the transistor and the desired resolution of characterization data therefor. For example, one embodiment of the present invention may provide a plurality (e.g., 3, 6, 10, 15) different stress voltages, ranging between 150% and 180% of $V_{DDop}$. Component 210 provides a square wave signal of a fixed frequency to the delay chain. While component 210 holds this fixed-frequency signal, the stress voltage supply to structures 204 is varied to its desired values, and a number of tap delay measurements for each stress voltage are compiled by evaluation component 208. This data is then evaluated or otherwise processed to model transistor failure time with respect to operational voltage. Evaluation component 208 may comprise a number of analytical tools or constructs, or combinations thereof, including: one or more data processing constructs executed by a processor; printed or visual data output in tabular or graphical; or other suitable manual or automated systems that compile characterization data from system 200.

Figure 3:
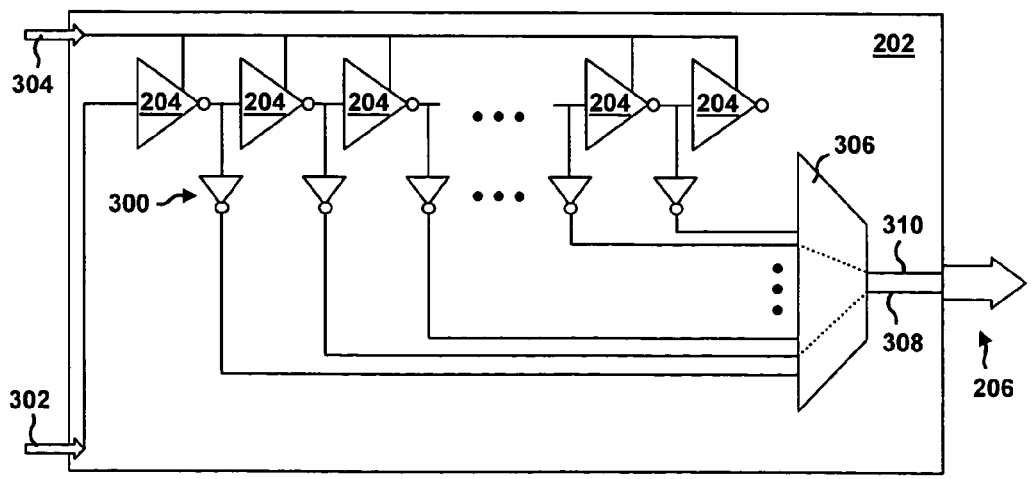
FIG. 3 provides an illustration depicting one embodiment of an evaluation structure referenced in FIG. 2.

Referring now to FIG. 3, one illustrative embodiment of structure 202 is depicted. Structure 202 comprises a plurality of sample structures 204, depicted as inverters, arranged in a multi-tap delay chain configuration. In this embodiment, inverters are selected as a sample structure because they provide a simple and useful arrangement of the device that is to be characterized—the transistor. In other embodiments of the present invention, other arrangements of transistors may be utilized, or sample structures comprising some other device of concern may be utilized. In the embodiment depicted in FIG. 3, a series of taps 300 are coupled respectively to structures 204, such that each tap 300 is operatively associated with a gap between adjacent or adjoining inverters 204 in the chain. In FIG. 3, the taps 300 are also depicted as inverters, although any suitable structure operating in accordance with the present invention may be utilized. The inverters 204 receive a constant frequency input signal, via input 302, from component 210. The inverters 204 also receive a stress supply voltage, via input 304, from component 212.

A multiplexing component 306 is provided, coupled to the chain via the taps 300. Component 300 is operated to select a first tap 308 and a second tap 310, and provide a measure of the delay chain signal at each respective tap. In alternative embodiments, other selective circuitry may be utilized in place of a multiplexer. The amount of signal delay associated with the number of inverters between taps 308 and 310 is determined therefrom. In alternative embodiments, the number and relative position of taps 300 may be varied, depending upon the relative size and speed of the inverters 204, and the desired resolution of signal delay measurement. For example, one alternative embodiment may provide a single tap only after every third (or fourth, or fifth) inverter in the delay chain. For a number of embodiments, however, somewhere between ten to fifty taps provide sufficient resolution without sacrificing system efficiency.

Regardless of the configuration of taps 300, output 206 communicates data regarding the selected taps 308 and 310 and the delay therebetween to component 208. Other taps may then be selected and measured, while supply voltage 304 is held at the same value, or supply voltage 304 may be adjusted to a different stress supply voltage and tap delay(s) measured again.

In such a manner, data regarding inverter performance degradation with respect to varying stress supply voltages, at constant operational frequency, is compiled for evaluation. Without any frequency variance, an accurate assessment of failure times at accelerated voltage(s) is developed. This assessment may then be extrapolated to specify device lifetime at normal operating conditions with optimal accuracy.

Similar characterizations determining lifetime degradations due to frequency variances may also be developed utilizing the present invention. Since supply voltage to structure 202 is controlled by component 212, that voltage may be held at a constant level while the signal frequency supplied from component 210 is varied. Varying the signal frequency supplied by component 210 may be relatively simple, depending upon the particular implementation of component 210. Generally, component 210 must provide a fixed or constant frequency signal to structure 202 that is tolerant of, or unaffected by, variations in the voltage supplied by component 212. A number of circuits may thus be provided, such as phase-locked loop (PLL) circuits or self-biasing frequency source circuits.

Figure 4:
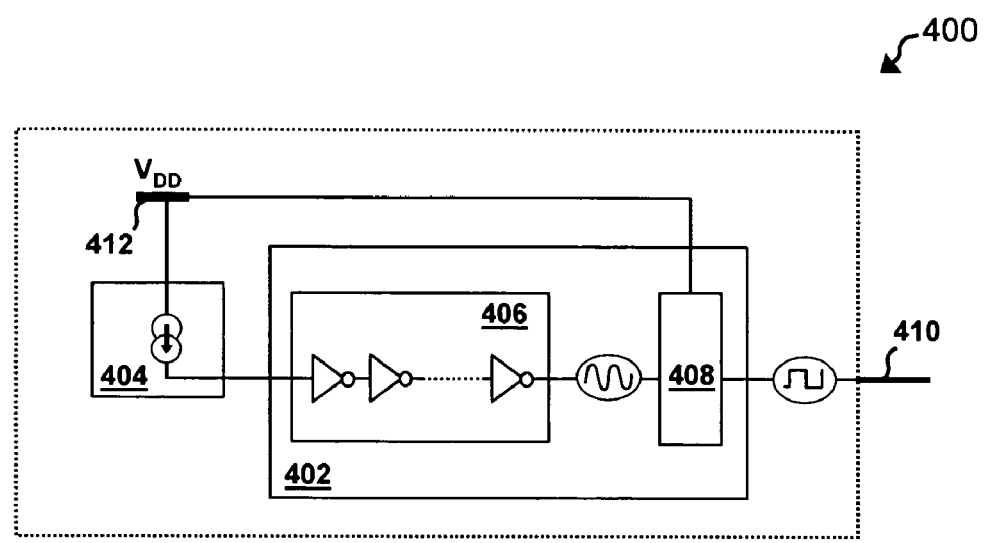
FIG. 4 provides an illustration depicting one embodiment of a controlled signal source component referenced in FIG. 2.

One particularly efficient embodiment of a controlled frequency source component 400 is illustrated now with reference to FIG. 4. Component 400 comprises an isolated ring oscillator component 402 and a controllable current component 404. Component 404 comprises any suitable controllable current source, such as a current controlled current mirror. Component 402 comprises a single ring oscillator circuit 406 and a signal rectification circuit 408. Circuit 406 comprises an odd number (N) of inverters in series driven by current component 404. The number of inverters in circuit 406 may be varied according to a variety of factors, such as the desired or required output signal frequency, or the relative size of the inverters utilized. Generally, however, a larger quantity of inverters will result in a lower output signal frequency.

Circuit 406 supplies a signal, such as a sine wave or other similar analog signal, to signal rectification circuit 408. Circuit 408 processes or conditions the signal for transmission to an evaluation structure via output 410. Depending upon the nature or requirements of an associated evaluation structure, circuit 408 may perform a number of tasks on the signal received from circuit 406, such as filtering or amplification. In the embodiment depicted in FIG. 4, circuit 408 performs a divide-by-2 function, rending a digital-compatible square wave signal for output 410.

Component 404 and circuit 408 are supplied by a voltage supply 412. Supply 412 is independent and, if necessary, electrically isolated, from the systems stress voltage supply. This obviates any variance in output signal frequency from component 400 due to variations in a stress voltage supply signal.

As an alternative to, or in addition to, the variable stress voltage characterization described above, the same structure may also be utilized to provide a characterization of a transistor's response or behavior to varying signal frequencies. While the stress voltage supply is held at a constant voltage, the frequency source component may be varied as data is compiled from the signal taps. Similar to the analysis of stress voltage effects, characterization or modeling of frequency stress effects may be accurately developed therefrom—free from any variance of or dependency upon the stress voltage supply value(s). In such a manner, an optimal characterization of a number of behavioral and operational aspects of a transistor may be produced.

Thus, utilizing the structures and methods of the present invention, a device structure of concern is accurately characterized under accelerated stress testing conditions. Behavioral and parametric interdependencies are effectively and efficiently obviated through the provision of segmented test circuitry and operations. Data representative of a particular semiconductor device or structure sample's response to one or more accelerated operational stressors is independently compiled. This data is then extrapolated or otherwise processed to specify the device's maximum operational characteristics or lifetimes at normal operating conditions.

The embodiments and examples set forth herein are thus presented to best explain the present invention and its practical application, and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. As stated throughout, many modifications and variations are possible in light of the above teaching without departing from the spirit and scope of the following claims.

What is claimed is:

1. Circuitry performing accelerated stress characterization of a given transistor, the circuitry comprising:
   a plurality of inverter circuits, formed from the given transistor, disposed in series with one another;
   a plurality of signal taps, each respectively and operatively associated with one gap between adjacent inverter circuits in the series thereof;
   selective circuitry, operatively coupled to the plurality of signal taps and adapted to select a first and a second of the plurality of signal taps;
   a controlled voltage component, operatively coupled the plurality of inverter circuits and adapted to supply a desired supply voltage thereto;
   a controlled signal component, operatively coupled the plurality of inverter circuits and adapted to supply a signal of a desired frequency thereto; and
   an evaluation component, adapted to receive signal data from the first and second signal taps.

2. The circuitry of claim 1, wherein plurality of inverter circuits disposed in series comprises at least eleven inverter circuits, and the plurality of signal taps comprise at least ten taps.

3. The circuitry of claim 1, wherein each gap between adjacent inverter circuits has a signal tap operatively coupled thereto.

4. The circuitry of claim 1, wherein each signal tap comprises an inverter circuit.

5. The circuitry of claim 1, wherein the selective circuitry comprises a multiplexer.

6. The circuitry of claim 1, wherein the controlled signal component comprises a constant frequency signal circuit.

7. The circuitry of claim 6, wherein the controlled signal component comprises a phase locked loop circuit.

8. The circuitry of claim 6, wherein the controlled signal component comprises a self-biasing frequency source circuit.

9. The circuitry of claim 6, wherein the controlled signal component comprises a ring oscillator circuit.

10. The circuitry of claim 6, wherein the ring oscillator circuit comprises:
    an independent voltage supply;
    a controllable current component driven by the independent voltage supply;
    a single ring oscillator circuit driven by the controllable current component; and
    a signal rectification component, driven by the independent voltage supply, receiving a signal from the single ring oscillator circuit, and outputting a rectified version of the signal from the single ring oscillator circuit.

11. The circuitry of claim 10, wherein the independent voltage supply is electrically isolated from the controlled voltage component.

12. The circuitry of claim 10, wherein the controllable current component comprises a current controlled current mirror.

13. The circuitry of claim 10, wherein the signal rectification component comprises a divide-by-two circuit.

14. A method of characterizing performance of a given transistor, the method comprising the steps of:
    providing a plurality of inverter circuits, formed from the given transistor, disposed in series with one another;
    providing a plurality of signal taps, each respectively and operatively associated with one gap between adjacent inverter circuits in the series thereof;
    providing selective circuitry, operatively coupled to the plurality of signal taps and adapted to select a first and a second of the plurality of signal taps;
    supplying a fixed frequency source signal to the plurality of inverter circuits;
    supplying a first supply voltage to the plurality of inverter circuits;
    compiling a first set of signal data from the first and second signal taps;
    supplying a second supply voltage to the plurality of inverter circuits;
    compiling a second set of signal data from the first and second signal taps; and
    processing the first and second sets of signal data to determine a desired transistor performance characteristic.

15. The method of claim 14, wherein the step of providing selective circuitry further comprises providing a multiplexer.

16. The method of claim 14, wherein the step of providing a fixed frequency source signal further comprises providing a ring oscillator circuit.

17. The method of claim 16, wherein the step of providing a ring oscillator circuit further comprises:
    providing an independent voltage supply;
    providing a controllable current component driven by the independent voltage supply;
    providing a single ring oscillator circuit driven by the controllable current component; and
    providing a signal rectification component, driven by the independent voltage supply, receiving a signal from the single ring oscillator circuit, and outputting a rectified version of the signal from the single ring oscillator circuit.

18. The method of claim 17, wherein the step of providing a controllable current component comprises a current controlled current mirror.

19. The method of claim 17, wherein the step of providing a signal rectification component further comprises providing a divide-by-two circuit.

20. A semiconductor device characterization system comprising:
    an evaluation structure, comprising an arrangement of one or more sample devices;
    a first control component, operatively coupled to the evaluation structure and adapted to control a first operational parameter of the evaluation structure;
    a second control component, operatively coupled to the evaluation structure and adapted to control a second operational parameter of the evaluation structure independent of any variance in the first operational parameter; and
    an evaluation component, adapted to receive and compile data from the evaluation structure as either the first or second operational parameters are varied.

* * * * *